(12) United States Patent
Saitoh

(10) Patent No.: US 6,819,160 B2
(45) Date of Patent: Nov. 16, 2004

(54) SELF-TIMED AND SELF-TESTED FUSE BLOW

(75) Inventor: Toshiharu Saitoh, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/293,340

(22) Filed: Nov. 13, 2002

(65) Prior Publication Data

US 2004/0090261 A1 May 13, 2004

(51) Int. Cl.[7] .............................................. H01H 37/76
(52) U.S. Cl. ...................... 327/525; 327/526; 361/104
(58) Field of Search ............................... 327/525, 526; 365/225.7, 96; 361/56, 91.1, 111, 118, 103, 104

(56) References Cited

U.S. PATENT DOCUMENTS

| | | | |
|---|---|---|---|
| 4,630,241 A | 12/1986 | Kobayashi et al. | 365/200 |
| 5,548,555 A | 8/1996 | Lee et al. | 365/200 |
| 5,608,685 A | 3/1997 | Johnson et al. | 365/230.06 |
| 5,659,510 A | 8/1997 | Kwon et al. | 365/200 |
| 5,748,543 A | 5/1998 | Lee et al. | 365/200 |
| 5,959,909 A | 9/1999 | Peng et al. | 365/200 |
| 5,966,339 A | 10/1999 | Hsu et al. | 365/225.7 |
| 5,991,220 A | 11/1999 | Freyman et al. | 365/225.7 |
| 6,021,075 A | 2/2000 | Ueno | 365/200 |
| 6,166,981 A | 12/2000 | Kirihata et al. | 365/225.7 |
| 6,255,835 B1 | 7/2001 | Oh et al. | 324/763 |
| 6,268,760 B1 | 7/2001 | Marshall et al. | 327/525 |
| 6,459,621 B1 * | 10/2002 | Kawahara et al. | 365/185.24 |

FOREIGN PATENT DOCUMENTS

JP        56111194        9/1981

OTHER PUBLICATIONS

Keum, Auto Fusing Circuit, US 2002/0093373A1, Jul. 18, 2002.*

* cited by examiner

*Primary Examiner*—Timothy P. Callahan
*Assistant Examiner*—Hiep Nguyen
(74) *Attorney, Agent, or Firm*—Richard A. Henkler; Hoffman, Warnick & D'Alessandro LLC

(57) ABSTRACT

An apparatus and method for blowing fuses in an integrated circuit. The apparatus and method use a plurality of fuse blowing circuits coupled serially. Each successive fuse blowing circuit is activated by an activate signal generated by a previous fuse blowing circuit. The apparatus and method provide for the fuse blowing operation to be both self-timing and self-testing.

15 Claims, 3 Drawing Sheets

SELF-TIMED AND SELF-TESTED FUSE BLOW

BACKGROUND OF THE INVENTION

1. Technical Field

The current invention relates to an electrical fuse blow apparatus and method in integrated circuits. In particular, this invention relates to an apparatus and method for serially blowing selected fuses, in which each successive fuse blowing circuit is activated by a signal generated by a preceding fuse blowing circuit.

2. Background Art

In integrated circuits, fuses are frequently used to configure operation of a device or to provide redundant functionality that can be selectively disabled when a problem arises. In modern devices, thousands of fuses can be included on any one chip. Sizing considerations make it desirable to maximize the density in which these fuses are implemented. Because of size limitations with other types of fuses, electrical fuses are commonly selected to implement this functionality.

In configuring a device, it is often desirable to blow hundreds or even thousands of the fuses in a blow operation. Maximum efficiency would be obtained if all the desired fuses were capable of being blown simultaneously. However, each electrical fuse requires a certain amount of current to successfully be blown. Consequently, several problems arise when the simultaneous blowing of many fuses is attempted. For example, a poorer quality of fuse blowing (i.e., some fuses don't blow or only partially blow) may result. Additionally, the thickness and width of the wiring in the circuit may need to be increased to accommodate a higher current.

As a result, several solutions have been suggested to limit the number of fuses blown at once during a fuse blowing operation. In one example, the blow operation is implemented in successive blow steps. Prior to each blow step, blow data is pre-loaded designating a limited number of the desired fuses to be blown. A blow clock then activates each of the designated blow circuits for a sufficient amount of time to allow the fuses to blow. This process is repeated until all the desired fuses have been blown. However, this solution has several disadvantages. First, several pre-loadings may be required to blow a large number of fuses. Additionally, the system often requires software support for performing the pre-loadings. Still further, since the fuses may require varying times before blowing, the blow clock must activate the designated blow circuits for a sufficient time to ensure that all fuses are properly blown.

Another solution allows all of the blow data to be pre-loaded at once. Subsequently, a blow circuit or a group of blow circuits is sequentially selected using, for example, a shift resistor control. In this fashion, a blow pulse is sequentially generated for each blow circuit or group of blow circuits. The blow pulse causes any designated blow circuit that is currently selected to be activated and the fuse to blow. The next blow circuit or group of blow circuits is then selected, and the process is repeated until all blow circuits have been included. While only a single data pre-loading is required, this solution attempts to blow fuses that are not designated for blowing. Further, a long blow pulse remains necessary to accommodate all fuses. Both solutions discussed also require a separate testing operation for each of the desired fuses to determine if it was blown properly.

As a result, there exists a need for a self-timed and self-tested fuse blowing apparatus and method. In particular, there exists a need in which each fuse blowing circuit remains active for only the necessary time to blow the particular fuse. Further, there exists a need for a fuse blowing apparatus that requires a simplified test to determine whether the fuses were blown properly.

SUMMARY OF THE INVENTION

The current invention provides an apparatus and method for serially blowing fuses wherein each succeeding fuse blowing circuit is activated by a signal generated by a previous fuse blowing circuit.

A first aspect of the invention provides an apparatus for blowing fuses in an integrated circuit, comprising: a plurality of fuse blowing circuits coupled serially, wherein each succeeding fuse blowing circuit is activated by an activate signal generated by a previous fuse blowing circuit.

A second aspect of the invention provides an apparatus for blowing fuses, comprising: a plurality of fuse blowing circuits coupled serially, wherein each succeeding fuse blowing circuit is activated based on an activate signal from a previous fuse blowing circuit and enabled based on an enable signal.

A third aspect of the invention provides a method of blowing fuses in an integrated circuit, comprising: serially coupling a plurality of fuse blowing circuits; generating an activate signal using an active fuse blowing circuit; and activating each successive fuse blowing circuit based on the activate signal generated by a preceding fuse blowing circuit.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The current invention provides an apparatus and method for serially blowing fuses, wherein each succeeding fuse blowing circuit is activated based on a signal generated by a previous fuse blowing circuit. The apparatus and method of the current invention beneficially allow a fuse to be efficiently bypassed when it is not to be blown, and delay for the minimum amount of time necessary to blow a fuse. When an activate signal is based on either the circuit being bypassed or the fuse being blown, the invention provides both a self-timing and self-testing apparatus and method for blowing fuses.

Figure 1:
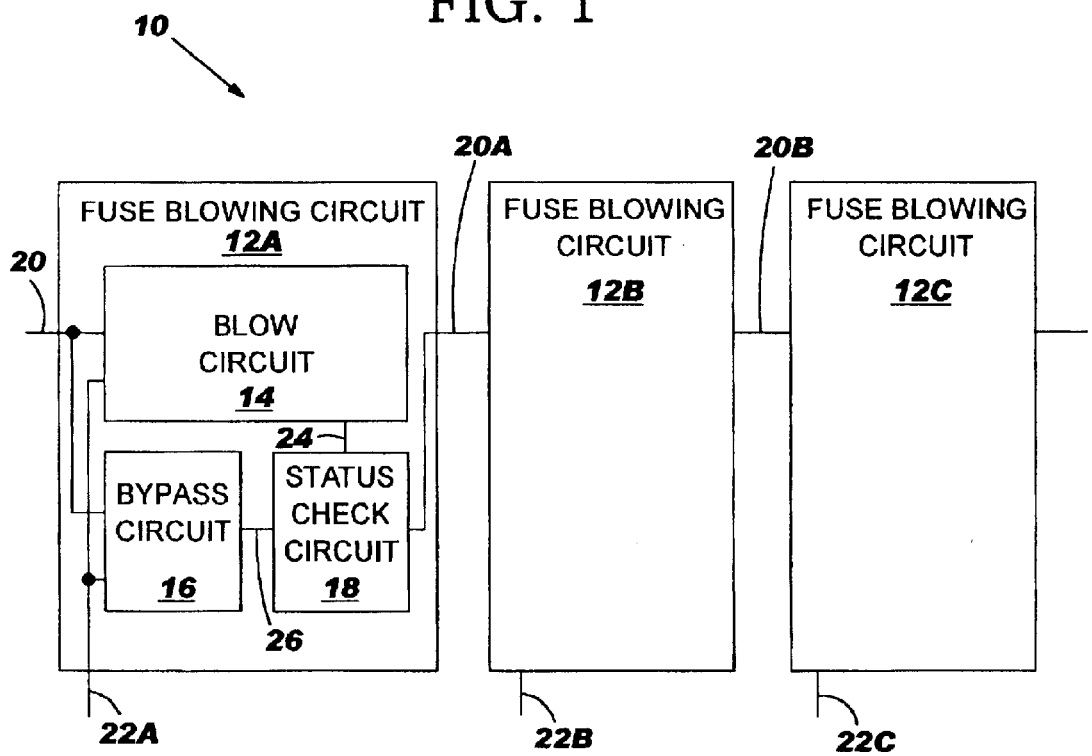
FIG. 1 depicts a partial functional block diagram of an apparatus according to one aspect of the invention.

Turning to the Figures, FIG. 1 depicts a partial functional block diagram of an illustrative apparatus 10. Apparatus 10 is shown including a plurality of fuse blowing circuits 12A, 12B, 12C. Fuse blowing circuits 12A, 12B, 12C are coupled serially by activate signal lines 20A, 20B. In operation, each fuse blowing circuit 12A, 12B, 12C is activated based on an activate signal 20. For an initial fuse blowing circuit, activate signal 20 can be generated by a start signal source. For each succeeding fuse blowing circuit, activate signal 20 is generated by a previous fuse blowing circuit. Consequently, fuse blowing circuit 12B is activated by activate signal 20A generated by fuse blowing circuit 12A. Similarly, fuse blowing circuit 12C is activated by activate signal 20B generated by fuse blowing circuit 12B.

Fuse blowing circuit 12A is shown including a blow circuit 14, a bypass circuit 16, and a status check circuit 18. Fuse blowing circuits 12B, 12C also include similar circuits, but are not shown for brevity. Enable signals 22A, 22B, 22C are provided prior to the respective fuse blowing circuit 12A, 12B, 12C being activated. Operation of fuse blowing circuits 12A, 12B, 12C is based on the enable signal. For example, if enable signal 22A is high, blow circuit 14 blows the fuse and generates a blown signal 24. However, when enable signal 22A is low, bypass circuit 16 generates a bypass signal 26 and blow circuit 14 does not blow the fuse. Status check circuit 18 generates activate signal 20A based on blown signal 24 and bypass signal 26.

Figure 2:
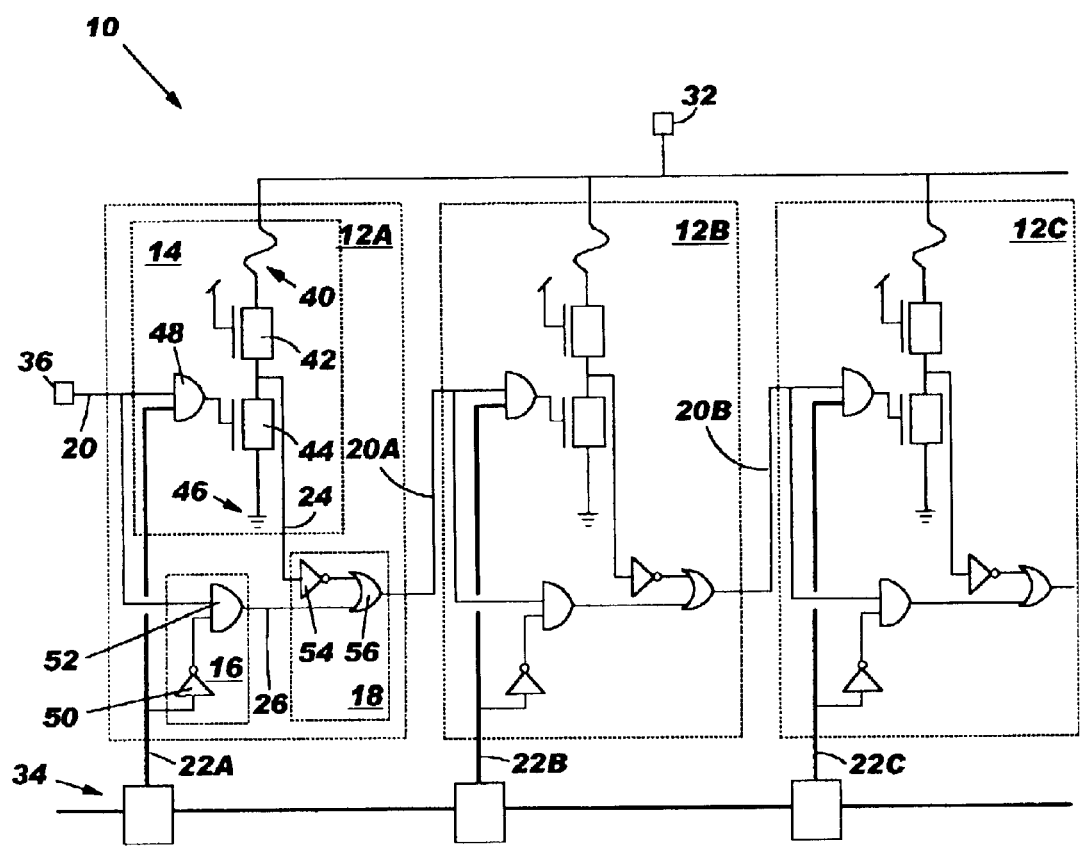
FIG. 2 depicts an illustrative implementation of the apparatus of FIG. 1.

FIG. 2 depicts an illustrative implementation of apparatus 10. Voltage source 32 is shown coupled to each fuse blowing circuit 12A, 12B, 12C. Voltage source 32 generates sufficient current in each fuse blowing circuit 12A, 12B, 12C to blow the fuse. Additionally, enable circuit 34 is shown coupled to each fuse blowing circuit 12A, 12B, 12C. Enable circuit 34 generates enable signals 22A, 22B, 22C for each fuse blowing circuit 12A, 12B, 12C. For example, enable circuit 34 can comprise one SR latch or other memory element for each fuse blowing circuit that are all loaded with the desired data in a single load operation. To start blowing fuses, start signal source 36 generates an activate signal 20 to activate fuse blowing circuit 12A.

Blow circuit 14 includes a fuse 40, a first transistor 42, and a second transistor 44 coupled serially between voltage source 32 and ground 46. First transistor 42 is tied high, and is therefore always enabled. Prior to fuse blowing circuit 12A being activated, second transistor 44 is disabled making blown signal 24 high. Second transistor 44 is enabled by performing a logical AND operation 48 on activate signal 20 and enable signal 22A. Consequently, a circuit from voltage source 32 to ground 46 is completed once activate signal 20 and enable signal 22A are both high. Therefore, blow circuit 14 only blows fuse 40 when activate signal 20 and enable signal 22A are both high. Once fuse 40 has blown, the electrical path from voltage source 32 to blown signal 24 is disabled while the path to ground 46 remains enabled, making blown signal 24 low.

During the blow operation, blown signal 24 should remain high so that the next blow circuit does not activate before fuse 40 has blown. Consequently, the resistance of fuse 40, and transistors 42, 44 should be appropriately selected based on voltage source 32 so that blown signal 24 remains high during the blow operation. It is understood that in addition to the circuit elements shown, or in place of transistor 42, one or more resistors or similar elements can be used to properly balance the resistance of blow circuit 14 to ensure that blown signal 24 transitions as desired.

Due to a resistance change in fuse 40 during the blow operation, blown signal 24 may transition from high to low before fuse 40 completely blows. This may cause another blow circuit to become activated before the blow operation has completed. However, because transistor 44 remains active, the blow operation for fuse 40 will complete, thereby reducing the potential overlap of the blow operations. The selection of voltage source 32 and the various wiring and devices implementing apparatus 10 may account for the possible overlap of blow operations. Alternatively, additional delay circuitry can be included to further reduce any potential overlap of blow operations, however this adversely impacts the efficiency of apparatus 10.

Bypass circuit 16 generates bypass signal 26 based on activate signal 20 and enable signal 22A. To generate bypass signal 26, bypass circuit 16 performs a logical NOT operation 50 on enable signal 22A, and then combines the result with activate signal 20 using a logical AND operation 52. When fuse 40 is to be skipped (i.e., not blown), enable signal 22A is set to low. In this case, when activate signal 20 activates fuse blowing circuit 12A, bypass circuit 16 generates a high bypass signal 26.

Status check circuit 18 generates activate signal 20A based on blown signal 24 and bypass signal 26. To generate activate signal 20A, status check circuit 18 performs a logical NOT operation 54 on blown signal 24, and then combines the result with bypass signal 26 using a logical OR operation 56. Consequently, activate signal 20A only transitions from low to high once fuse 40 is blown, or enable 22A is low and activate signal 20 is high. As a result, each succeeding fuse blowing circuit is activated once the previous fuse has blown, or the fuse has been bypassed.

Figure 3:
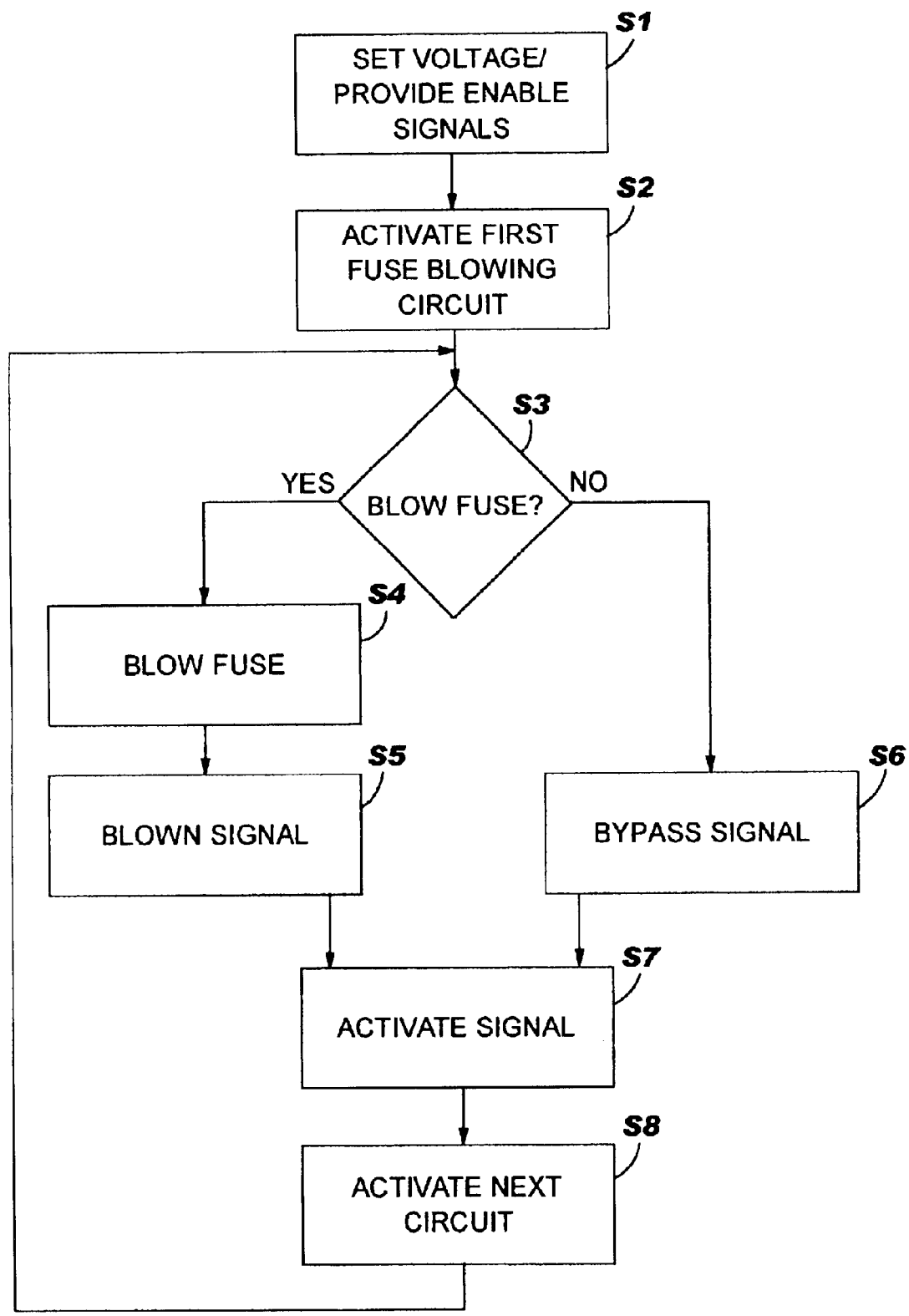
FIG. 3 depicts a method of blowing fuses according to another aspect of the invention.

FIG. 3 depicts an illustrative method of blowing fuses according to the invention. Initially, the apparatus is properly configured to perform the blow operation. In step S1, the enable signals are provided and a required amount of voltage is provided by a voltage source. Subsequently, a first fuse blowing circuit is activated in step S2. In step S3, the active fuse blowing circuit determines whether the fuse is to be blown based on the enable signal. If the fuse is to be blown, the fuse blowing circuit blows the fuse in step S4 and generates a blown signal in step S5 once the fuse is blown. Otherwise, the fuse blowing circuit generates a bypass signal in step S6. An activate signal is generated in step S7 based on the blown signal and the bypass signal. This activates the next fuse blowing circuit in step S8, which repeats the process starting at step S3.

While the illustrative apparatus and method discussed above describe blowing one fuse at a time, it is understood that the current invention can be implemented to blow any number of fuses simultaneously. For example, the fuses in an integrated circuit can be arranged in a plurality of serial paths, in which a first fuse blowing circuit in each serial path is activated by the same start signal. Further, while each fuse blowing circuit is described as including a bypass circuit and a status check circuit, it is understood that the final fuse blowing circuit in a serial path does not require these circuits.

Once a fuse blowing operation has been performed, determining whether the fuse blowing operation has been completed successfully is greatly simplified as compared to previous implementations. Each succeeding fuse blowing circuit is only enabled after a previous fuse blowing circuit has either blown the fuse or been bypassed. Because of this, the entire fuse blowing operation can be confirmed by checking an activate signal generated by the final fuse blowing circuit in a serial path. Once the signal goes high, all fuses have been either blown or bypassed, and the operation has completed successfully. Alternatively, the final fuse to be blown can be checked to confirm that it has blown properly.

Additionally, the serial connection between fuse blowing circuits can be verified quickly by activating the first circuit when all enable lines are low (bypass). The final fuse blowing circuit should become activated after all circuits have been bypassed. If during either a test or a fuse blowing operation, the final fuse blowing circuit fails to be activated after a certain time frame, it can quickly be determined where the operation has stalled based on the active signals of the various fuse blowing circuits in the serial path.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An apparatus for blowing fuses in an integrated circuit, comprising:
    a plurality of fuse blowing circuits coupled serially, wherein a succeeding fuse blowing circuit is activated by an activate signal generated by a previous fuse blowing circuit, and wherein the previous fuse blowing circuit generates the activate signal by logically combining a bypass signal that indicates whether a fuse will be blown and a blown signal, and wherein at least one of the plurality of fuse blowing circuits includes a blow circuit comprising:
    a first transistor serially coupled to a fuse; and
    a second transistor serially coupled to the first transistor and a ground.

2. The apparatus of claim 1, wherein the activate signal is based on the fuse in the previous fuse blowing circuit being blown.

3. The apparatus of claim 1, wherein the activate signal is based on the previous fuse blowing circuit being bypassed.

4. The apparatus of claim 1, further comprising a start signal source for activating a first fuse blowing circuit.

5. The apparatus of claim 1, further comprising a voltage source for generating sufficient current in each fuse blowing circuit to blow a fuse.

6. The apparatus of claim 1, further comprising an enable circuit for enabling at least one of the plurality of fuse blowing circuits.

7. An apparatus for blowing fuses, comprising:
    a plurality of fuse blowing circuits coupled serially, wherein each fuse blowing circuit is activated based on an activate signal from a previous fuse blowing circuit and enabled based on an enable signal, and wherein each fuse blowing circuit includes;
    a bypass circuit for generating a bypass signal that indicates whether a fuse will be blown, wherein the bypass signal is generated by logically combining the activate signal and the enable signal; and
    a status check circuit for generating the activate signal based on the bypass signal and a blown signal.

8. The apparatus of claim 7, wherein each fuse blowing circuit includes a blow circuit for blowing the fuse.

9. The apparatus of claim 7, wherein the activate signal is generated by logically combining the bypass signal and the blown signal.

10. The apparatus of claim 9, wherein the bypass signal and a complement of the blown signal are combined by a logical OR operation.

11. The apparatus of claim 7, wherein the activate signal and a complement of the enable signal are logically combined by a logical AND operation to generate the bypass signal.

12. The apparatus of claim 7, wherein the bypass signal is high when the enable signal is low and the fuse blowing circuit is activated.

13. The apparatus of claim 7, wherein the blown signal is low after the fuse has blown.

14. The apparatus of claim 8, wherein the blow circuit comprises:
    a first transistor serially coupled to the fuse; and
    a second transistor serially coupled to the first transistor and a ground.

15. The apparatus of claim 14, wherein the second transistor is enabled based on the activate signal, and wherein the blown signal is based on a signal between the first transistor and the second transistor.

* * * * *